(12) United States Patent
Nakano (10) Patent No.: US 6,771,115 B2
(45) Date of Patent: Aug. 3, 2004

(54) INTERNAL VOLTAGE GENERATING CIRCUIT WITH VARIABLE REFERENCE VOLTAGE

(75) Inventor: Masaya Nakano, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/338,636

(22) Filed: Jan. 9, 2003

(65) Prior Publication Data

US 2004/0021500 A1 Feb. 5, 2004

(30) Foreign Application Priority Data

Jul. 30, 2002 (JP) ........................................ 2002-221381

(51) Int. Cl.[7] .............................. G05F 1/10; G05F 3/02
(52) U.S. Cl. ........................ 327/536; 327/541; 327/407
(58) Field of Search ................................ 327/536, 541, 327/589, 407, 408; 363/59, 60

(56) References Cited

U.S. PATENT DOCUMENTS 6,091,282 A * 7/2000 Kim ........................... 327/536
6,486,729 B2 * 11/2002 Imamiya ..................... 327/536
6,605,986 B2 * 8/2003 Tanzawa et al. ............ 327/536

FOREIGN PATENT DOCUMENTS

JP          8-237938          9/1996

* cited by examiner

Primary Examiner—Terry D. Cunningham
Assistant Examiner—Quan Tra
(74) Attorney, Agent, or Firm—McDermott Will & Emery LLP (57) ABSTRACT

A voltage dividing circuit outputs a divided voltage of a maximum output voltage which can be driven by a boosting pump. A reference voltage generating circuit outputs a first reference voltage corresponding to a target level of a boosted voltage. A level selecting circuit compares the level of the divided voltage with that of the first reference voltage to select one of the voltages that has a lower voltage level. Then the selected voltage is supplied as a second reference voltage to a level sensing circuit.

4 Claims, 10 Drawing Sheets

FIG.14B
PRIOR ART
STANDBY CURRENT

INTERNAL VOLTAGE GENERATING CIRCUIT WITH VARIABLE REFERENCE VOLTAGE

BACKGROUND OF THE INVENTION

1. Field of the Invention

The present invention relates to an internal voltage generating circuit and, in particular, to an internal voltage generating circuit to reduce current consumption in a standby state of a semiconductor memory device.

2. Description of the Background Art

Figure 8:
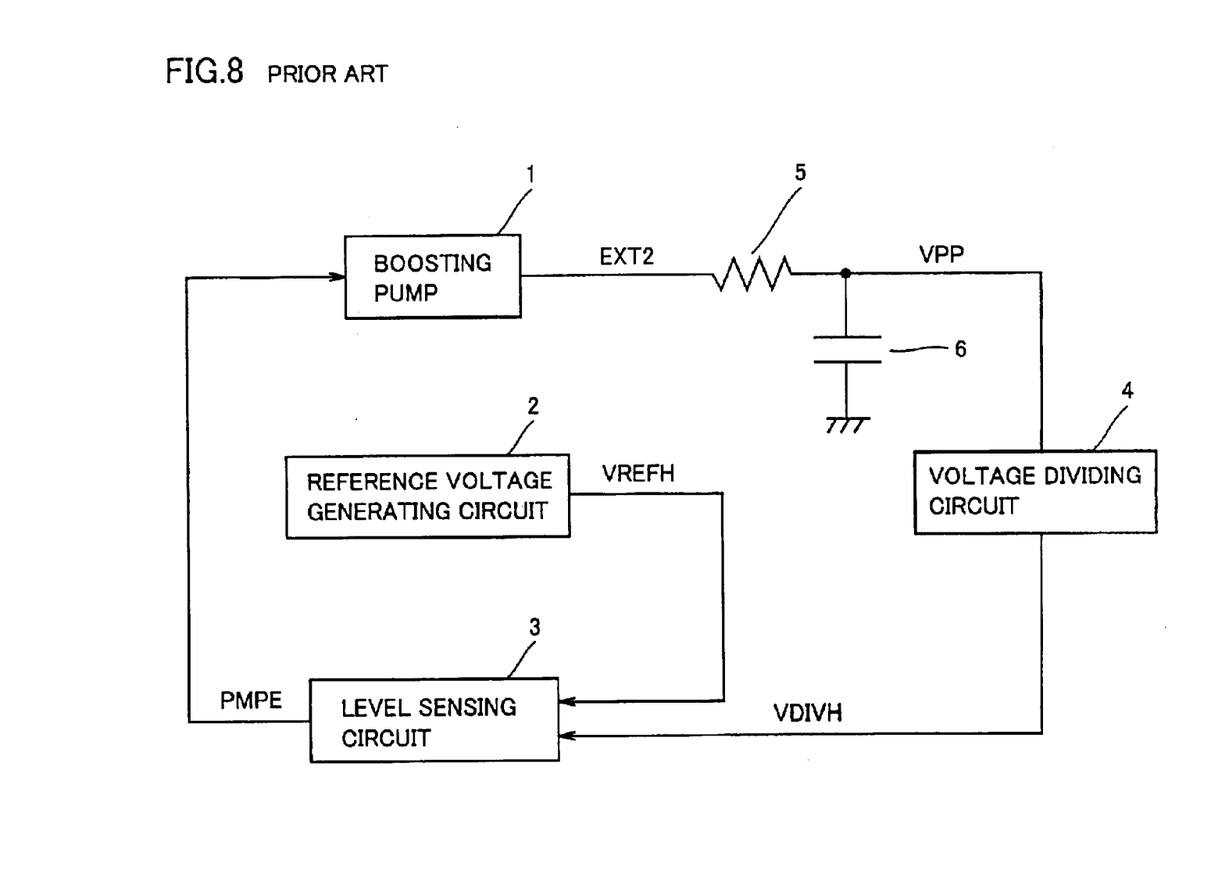
FIG. 8 is a functional block diagram illustrating functions of an exemplary conventional internal voltage generating circuit.

FIG. 8 is a functional block diagram illustrating functions of an exemplary conventional internal voltage generating circuit for a semiconductor memory device.

Referring to FIG. 8, the internal voltage generating circuit includes a boosting pump 1, a reference voltage generating circuit 2, a level sensing circuit 3, a voltage dividing circuit 4 for dividing a boosted voltage VPP, a resistor 5 connected to an output node of boosting pump 1, and a capacitor 6 connected between resistor 5 and the ground potential.

In this configuration, boosting pump 1 supplies a maximum output voltage EXT2 which can be driven by a charge pump operation, and accordingly boosted voltage VPP is generated through capacitive coupling of capacitor 6.

Boosted voltage VPP is then divided by voltage dividing circuit 4 and a resultant voltage, namely divided voltage VDIVH is supplied to one input of level sensing circuit 3. Reference voltage generating circuit 2 generates a reference voltage VREFH having a voltage level corresponding to a target level of an internal voltage, and this reference voltage is supplied to the other input of level sensing circuit 3.

Level sensing circuit 3 receives two signals respectively of divided voltage VDIVH and reference voltage VREFH to compare the level of voltage VDIVH with the level of voltage VREFH. If the level of voltage VDIVH is lower than that of voltage VREFH, level sensing circuit 3 outputs a sense signal (PMPE signal) of H (logical high) level to boosting pump 1. If the level of voltage VDIVH is higher than the level of voltage VREFH, level sensing circuit 3 outputs PMPE signal of L (logical low) level to boosting pump 1.

Boosting pump 1 performs a charge pump operation in a period in which PMPE signal has H level to generate the maximum output voltage EXT2 which can be driven, and boosted voltage VPP is accordingly generated through capacitive coupling of capacitor 6. If PMPE signal has L level, no charge pump operation is conducted by boosting pump 1.

Figure 9:
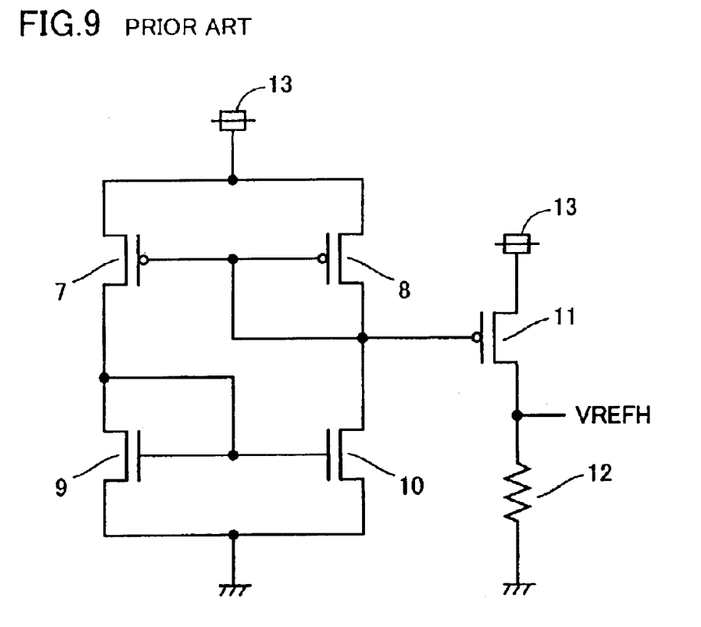
FIG. 9 is a detailed circuit diagram of an exemplary reference voltage generating circuit 2 of the conventional internal voltage generating circuit.

FIG. 9 is a detailed circuit diagram of an exemplary reference voltage generating circuit 2 as shown in FIG. 8.

Referring to FIG. 9, reference voltage generating circuit 2 includes p-channel transistors 7 and 8, n-channel transistors 9 and 10 connected in series to p-channel transistors 7 and 8, a p-channel transistor 11 constituting a current mirror circuit together with p-channel transistor 8, and a resistor 12.

P-channel transistors 7 and 8 have respective sources connected to a power supply node of an external power supply Vdd 13 and respective drains connected to respective drains of n-channel transistors 9 and 10. The drain of p-channel transistor 8 is also connected to respective gates of p-channel transistors 7, 8 and 11 and the drain of p-channel transistor 7 is also connected to respective gates of n-channel transistors 9 and 10. Respective sources of n-channel transistors 9 and 10 are grounded. The source of p-channel transistor 11 is connected to the power supply node of external power supply Vdd 13 and the drain thereof is grounded via resistor 12. The point of connection of the drain of p-channel transistor 11 and resistor 12 composes an output terminal of reference voltage VREFH.

In the configuration shown in FIG. 9, p-channel transistors 7 and 8 constitute a current mirror circuit, and a mirror current of the current flowing through p-channel transistor 8 flows through p-channel transistor 7.

Similarly, p-channel transistors 9 and 10 constitute a current mirror circuit, and a mirror current of the current flowing through p-channel transistor 9 flows through n-channel transistor 10.

As the drive current of p-channel transistor 8 is equal to the drive current of n-channel transistor 10, the current flowing through each of the transistors is uniquely determined by the drive current of n-channel transistor 9 and thus is dependent on an external power supply voltage to a small degree.

In addition, a mirror current of the current flowing through p-channel transistor 8 flows through p-channel transistor 11 and resistor 12, and predetermined reference voltage VREFH corresponding to the target level of boosted voltage VPP is output.

Figure 10:
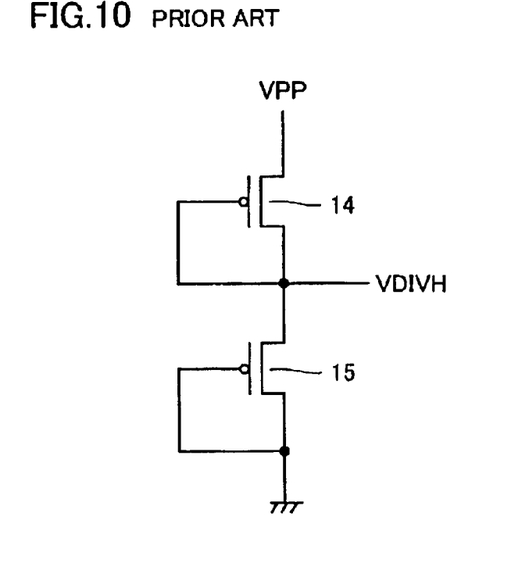
FIG. 10 is a detailed circuit diagram of an exemplary voltage dividing circuit 4 of the conventional internal voltage generating circuit.

FIG. 10 is a detailed circuit diagram showing an exemplary voltage dividing circuit 4.

Voltage dividing circuit 4 is composed of diode-connected p-channel transistors 14 and 15 provided in series between boosted voltage VPP and the ground potential, and divided voltage VDIVH of boosted voltage VPP is output from the drain of p-channel transistor 15.

Figure 11:
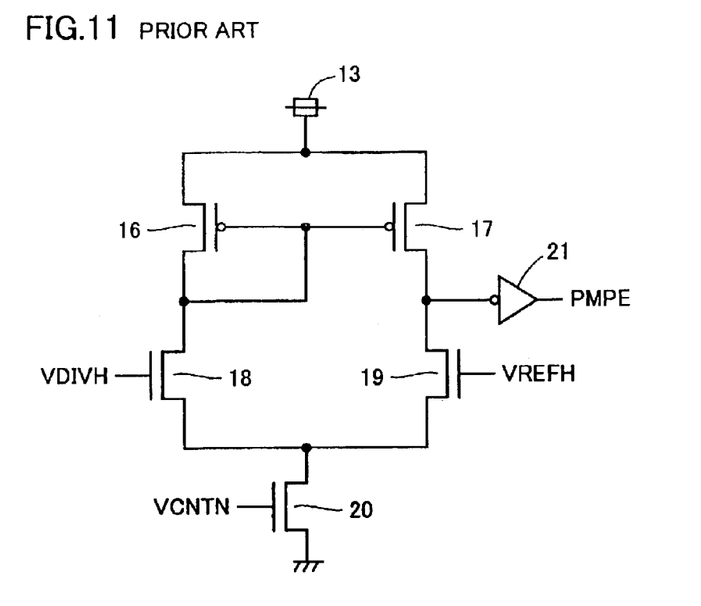
FIG. 11 is a circuit diagram showing a configuration of an exemplary level sensing circuit 3 of the conventional internal voltage generating circuit.

FIG. 11 is a circuit diagram showing a configuration of an exemplary level sensing circuit 3.

Level sensing circuit 3 includes a comparator detecting a potential difference between divided voltage VDIVH of boosted voltage VPP and reference voltage VREFH, and an inverter 21 inverting the result of the comparison to output sense signal PMPE.

The comparator includes a current-mirror differential amplifier composed of p-channel transistors 16 and 17 having respective sources connected to external power supply Vdd 13 and serving as load, an n-channel transistor 18 having its gate receiving divided voltage VDIVH and an n-channel transistor 19 having its gate receiving reference voltage VREFH, and an n-channel transistor 20 provided between the current-mirror differential amplifier and the ground potential and having its gate receiving a control voltage VCNTN which is set approximately at a threshold for the purpose of reducing the current flowing through the current-mirror differential amplifier.

In the configuration shown in FIG. 11, respective voltage levels of reference voltage VREFH and divided voltage VDIVH are compared with each other. If the level of voltage VREFH is higher than the level of voltage VDIVH, n-channel transistor 19 is turned on to pass a larger electric current so that the potential on the drain of p-channel transistor 17 has L level which is inverted by inverter 21 and accordingly PMPE signal of H level is output.

If the level of voltage VDIVH is higher than the level of voltage VREFH, n-channel transistor 18 is turned on to pass a larger electric current so that the potential on the drain of p-channel transistor 17 has H level and accordingly PMPE signal of L level is output from inverter 21.

Figure 12:
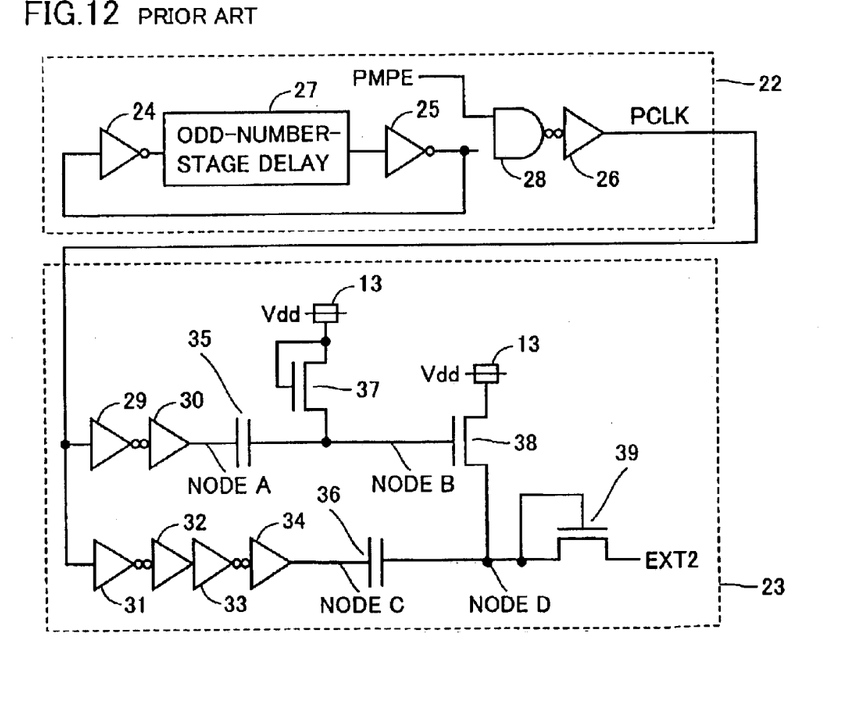
FIG. 12 is a detailed circuit diagram of an exemplary boosting pump 1 of the conventional internal voltage generating circuit.

FIG. 12 is a detailed circuit diagram showing an exemplary boosting pump 1 as shown in FIG. 8.

Referring to FIG. 12, boosting pump 1 is composed of a pump drive signal generating circuit 22 and a pump circuit 23.

Pump drive signal generating circuit 22 includes a two-input NAND circuit 28 having a first input node receiving, via inverters 24 and 25, a clock signal of a certain fixed cycle generated by a delay circuit constituted of an odd number of delay stages (odd-number-stage delay circuit) 27, and a second input node receiving PMPE signal from level sensing circuit 3, and an inverter 26 connected to an output node of two-input NAND circuit 28. Inverter 26 has its output node connected to respective input nodes of inverters 29 and 31 in pump circuit 23.

In this configuration, if PMPE signal has H level, the clock signal of the fixed cycle generated by odd-number-stage delay circuit 27 is output as a pump drive signal (PCLK signal) to respective input nodes of inverters 29 and 31 in pump circuit 23.

Pump circuit 23 includes inverters 29, 30, 31, 32, 33 and 34, capacitors 35 and 36, and n-channel transistors 37, 38 and 39.

Inverters 29 and 31 have respective input nodes receiving PCLK signal supplied from pump drive signal generating circuit 22.

Inverter 30 connected in series to inverter 29 has its output node (node A) connected to capacitor 35. N-channel transistor 37 has its source (node B) connected to capacitor 35 and the gate of n-channel transistor 38. N-channel transistor 37 has its gate and drain connected to external power supply Vdd 13.

Inverter 31 has its output node connected to an input node of inverters 32, 33 and 34 constituting three-stage inverter, and inverter 34 has its output node (node C) connected to capacitor 36.

N-channel transistor 38 has its source (node D) connected to capacitor 36 and the gate and drain of n-channel transistor 39.

In this configuration, pump circuit 23 receives PCLK signal from pump drive signal generating circuit 22 to conduct a voltage-boosting operation to output EXT2 signal corresponding to the maximum output voltage which can be driven.

Figure 13:
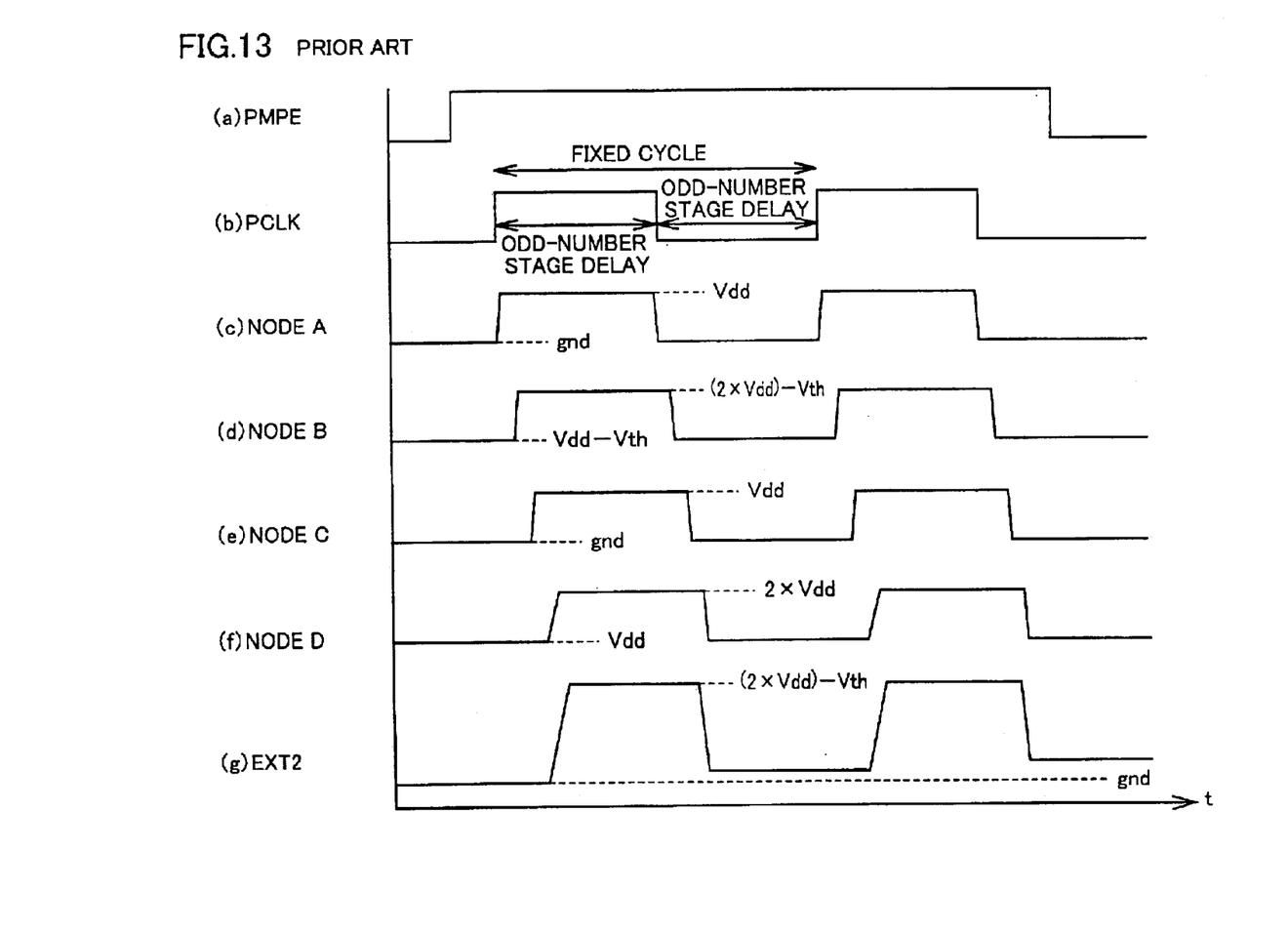
FIG. 13 is a timing chart illustrating a boosting operation of a pump circuit 23 shown in FIG. 12.

FIG. 13 is a timing chart illustrating a voltage-boosting operation by pump circuit 23 shown in FIG. 12.

Referring to FIG. 13, PMPE signal supplied from level sensing circuit 3 shown in FIG. 8 to pump drive signal generating circuit 22 has an operation waveform indicated by (a). An operation waveform of the pump drive signal (PCLK signal) supplied from pump drive signal generating circuit 22 to pump circuit 23 shown in FIG. 12 is indicated by (b). The potential on node A in FIG. 12 is indicated by (c), the potential on node B in FIG. 12 is indicated by (d), and the potential on node D in FIG. 12 is indicated by (f). The maximum output voltage EXT2 which can be driven and output from the source of n-channel transistor 39 in FIG. 12 is indicated by (g).

Referring to FIG. 13, PMPE signal rises to H level, and PCLK signal is output that is the clock signal of the fixed cycle generated by odd-number-stage delay circuit 27 of pump drive signal generating circuit 22 in FIG. 12.

Then, as PCLK signal rises to H level, the potential on node A in FIG. 12 increases from the ground level to the level of external power supply voltage Vdd, and the potential on node B charged to Vdd−Vth by n-channel transistor 37 becomes 2Vdd−Vth according to the principle of conservation of charge. Here, the threshold voltage of n-channel transistors 37, 38 and 39 is represented by Vth.

Accordingly, the gate of n-channel transistor 38 in FIG. 12 has 2Vdd−Vth so that node D is charged to the level of Vdd without decrease by the threshold voltage Vth.

Slightly after the increase of the potential on node A, the potential on node C increases from the ground level to the Vdd level and the level of node D changes from the level of Vdd to the level of 2Vdd according to the principle of conservation of charge.

As n-channel transistor 39 in FIG. 12 is diode-connected, the signal of EXT2, which is the maximum output voltage, is boosted to the potential of 2Vdd−Vth lower than 2Vdd by the threshold to generate boosted voltage VPP.

The above-described boosting operation is carried out in the conventional internal voltage generating circuit. In the conventional internal voltage generating circuit shown in FIG. 8, divided voltage VDIVH of boosted voltage VPP is always compared with reference voltage VREFH. If the level of voltage VDIVH is lower than the level of voltage VREFH, the charge pump operation of pump circuit 23 in FIG. 12 allows boosted voltage VPP to be held at a constant voltage all the time.

Regarding the conventional internal voltage generating circuit shown in FIG. 8, if the operating voltage is close to a lower limit of the external power supply voltage due to any variations for example in the manufacturing process, boosting pump 1 performs an excessive charge pump operation resulting in a problem of increase in the current consumption of a semiconductor memory device.

Figure 14A:
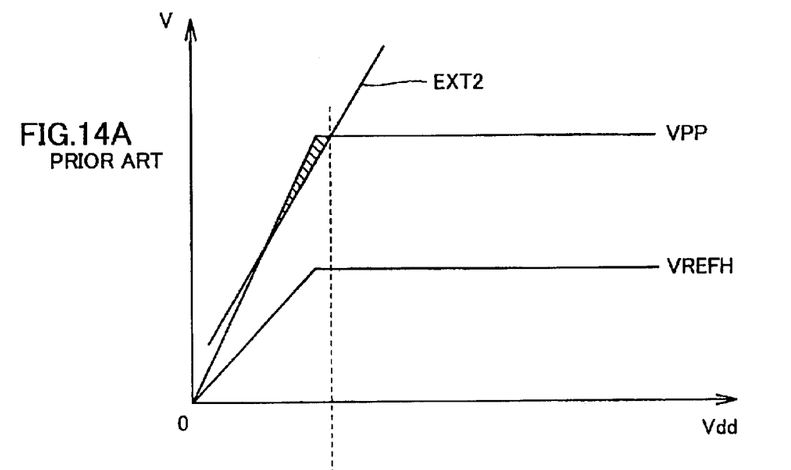
FIG. 14A shows dependency on the external power supply voltage of reference voltage VREFH, boosted voltage VPP and the maximum output voltage EXT2 of the boosting pump 1 of the conventional internal voltage generating circuit
Figure 14B:
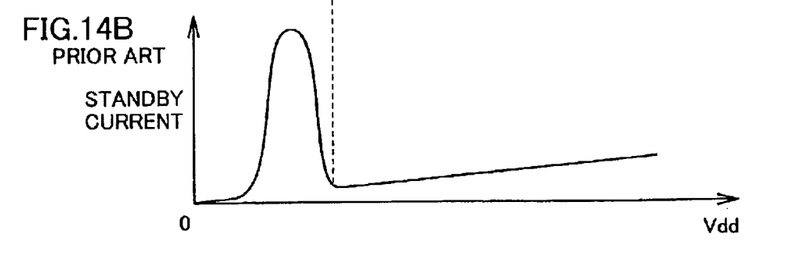
FIG. 14B shows dependency on the external power supply voltage of standby current.

Referring to FIGS. 14A and 14B, a mechanism of occurrence of the excessive operation in the conventional internal voltage generating circuit is described.

FIG. 14A shows dependency, on the external power supply voltage, of reference voltage VREFH, boosted voltage VPP to be generated by boosting pump 1 based on this reference voltage, and the maximum output voltage EXT2 which can be driven by boosting pump 1 of the conventional internal voltage generating circuit.

FIG. 14B shows dependency, on the external power supply voltage, of current consumption when a semiconductor memory device is in a standby state (standby current).

Referring to FIG. 14A, immediately after the semiconductor memory device is powered, the level of reference voltage VREFH provided from reference voltage generating circuit 2 in FIG. 8 increases as external power supply voltage Vdd increases, and then reaches a constant voltage level corresponding to a target level of boosted voltage VPP.

Level sensing circuit 3 compares the level of reference voltage VREFH with divided voltage VDIVH of boosted voltage VPP. If the level of voltage VDIVH is lower than the level of reference voltage VREFH, sensing circuit 3 provides PMPE signal of H level.

Boosting pump 1 then receives the PMPE signal of H level to output PCLK signal of the fixed cycle from pump drive signal generating circuit 22 shown in FIG. 12. When PCLK signal has H level, the charge pump operation of pump circuit 23 is activated to generate the maximum output voltage EXT2 and thus boosted voltage VPP is generated.

As shown in FIG. 14A, immediately after the semiconductor memory device is powered, the level of boosted voltage VPP increases with the increase of the level of voltage VREFH, since reference voltage VREFH is monitored by level sensing circuit 3 all the time. As voltage VREFH reaches a constant voltage level, voltage VPP is generated to be maintained at a constant voltage level according to reference voltage VREFH.

However, when external power supply voltage Vdd has a relatively low level, the level of the maximum output voltage EXT2 of boosting pump 1 could be lower than the level of boosted voltage VPP to be generated as shown in the region in FIG. 14A indicated by oblique lines.

It is noted that operating conditions of the semiconductor memory device are usually standardized. For example, a standard value of power supply voltage Vdd of a general-purpose DRAM (dynamic random access memory) is 5 V with a tolerance of ±10% in consideration of variations in a process. In FIGS. 14A and 14B, a lower limit of the external power supply voltage is indicated by the dotted line.

Then, as shown in FIG. 14A, the lower limit of the external power supply voltage (indicated by the dotted line) could be the one corresponding to the region (indicated by the oblique lines) where the maximum output voltage EXT2 of boosting pump 1 has a voltage level lower than the level of boosted voltage VPP to be generated.

Regarding the region indicated by the oblique lines, the desired level of boosted voltage VPP cannot be reached even through the charge pump operation by boosting pump 1 because of the low level of the maximum output voltage EXT2 which can be driven. Then, level sensing circuit 3 continues to generate the PMPE signal of H level and accordingly boosting pump 1 continues to perform the charge pump operation in pump circuit 23 shown in FIG. 12. Consequently, as shown in FIG. 14B, the excessive operation of boosting pump 1 increases the current consumption in a standby state (standby current) of the semiconductor memory device.

This excessive operation of boosting pump 1 could occur when the lower limit of the operating voltage of the semiconductor memory device is equal or close to the lower limit of the external power supply voltage indicated by the dotted lines in FIGS. 14A and 14B due to variations for example in the performance of transistors caused by of any variations in the manufacturing process.

Moreover, the excessive operation in the standby state of the semiconductor memory device leads to increase in the standby current shown in FIG. 14B.

One method for preventing this excessive operation is to increase the level of the maximum output voltage EXT2 of boosting pump 1 shown in FIG. 8 and another method thereof is to decrease the level of reference voltage VREFH of reference voltage generating circuit 2.

However, regarding the former one method, the enhanced drive ability of boosting pump 1 increases the standby current even when the operating voltage is in a normal operation range.

Regarding the latter another method, the decreased level of reference voltage VREFH causes decrease of boosted voltage VPP when the operating voltage is in the normal operation range, which influences the operation of the semiconductor memory device in an active state.

SUMMARY OF THE INVENTION

One object of the present invention is thus to provide an internal voltage generating circuit to reduce current consumption in a standby state of a semiconductor memory device without lowering the drive ability of a boosting pump and the level of a boosted voltage.

According to one aspect of the present invention, an internal voltage generating circuit generates an internal voltage of a semiconductor memory device, the internal voltage generating circuit staying in an operating state even when the semiconductor memory device is in a standby state. The internal voltage generating circuit includes a boosting circuit performing a charge pump operation to generate the internal voltage from a drive voltage produced from a supplied power supply voltage, a reference voltage generating circuit generating a reference voltage, and a level sensing circuit comparing the internal voltage with the reference voltage to output, to the boosting circuit, a signal indicative of result of the comparison to control on and off of the charge pump operation. The reference voltage generating circuit supplies as the reference voltage a voltage having its upper limit corresponding to a voltage level that can be driven by the boosting circuit in operation.

Preferably, the reference voltage generating circuit includes a constant voltage circuit generating a predetermined voltage corresponding to a target level of the internal voltage, a drive voltage input unit for inputting the drive voltage of the boosting circuit in operation, and a unit for comparing the predetermined voltage with the drive voltage of the boosting circuit and selecting as the reference voltage one of the voltages that has a lower voltage level to supply the selected voltage to the level sensing circuit.

According to another aspect of the present invention, the drive voltage input unit includes a voltage dividing circuit dividing the drive voltage of the boosting circuit, and a voltage adjusting circuit capable of adjusting the voltage divided by the voltage dividing circuit to generate a voltage of a lower voltage level, and an output voltage of the drive voltage input unit is the voltage supplied from the voltage adjusting circuit.

As discussed above, according to one aspect of the present invention, the reference voltage of the internal voltage generating circuit is set in such a way that an upper limit of the reference voltage is equal to the maximum output voltage which can be driven by the boosting pump. Accordingly, the excessive operation of the boosting pump is prevented that could occur when the operating voltage is close to the lower limit of the external power supply voltage, and thus standby current of the semiconductor memory device can be reduced.

Here, the reference voltage is generated by selecting, by a level selecting circuit, one of a predetermined voltage corresponding to a target level of an internal voltage with the maximum output voltage which can be driven by the boosting pump, the selected voltage having a lower voltage level and the selected voltage used as the reference voltage. The upper limit of the reference voltage thus corresponds to the upper limit of the drive ability of the boosting pump.

According to another aspect of the present invention, the reference voltage of the internal voltage generating circuit is set in such a way that an upper limit of the reference voltage is lower than the maximum output voltage which can be driven by the boosting pump. Accordingly, the excessive operation of the boosting pump is prevented that could occur when the operating voltage is close to the lower limit of the external power supply voltage, and thus standby current of the semiconductor memory device can be reduced.

The maximum output voltage which can be driven by the boosting pump is adjusted by the voltage adjusting circuit to a slightly lower voltage level to be supplied to the level selecting circuit. The excessive operation of the boosting pump is thus surely prevented without lowering the drive ability of the boosting pump.

No influence is exerted on the operation of the semiconductor memory device in an active state when the operating voltage is in a normal operation range, since boosted voltage VPP is set at a predetermined target level.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described in conjunction with the drawings in which the same or corresponding components are denoted by the same reference characters.

First Embodiment

Figure 1:
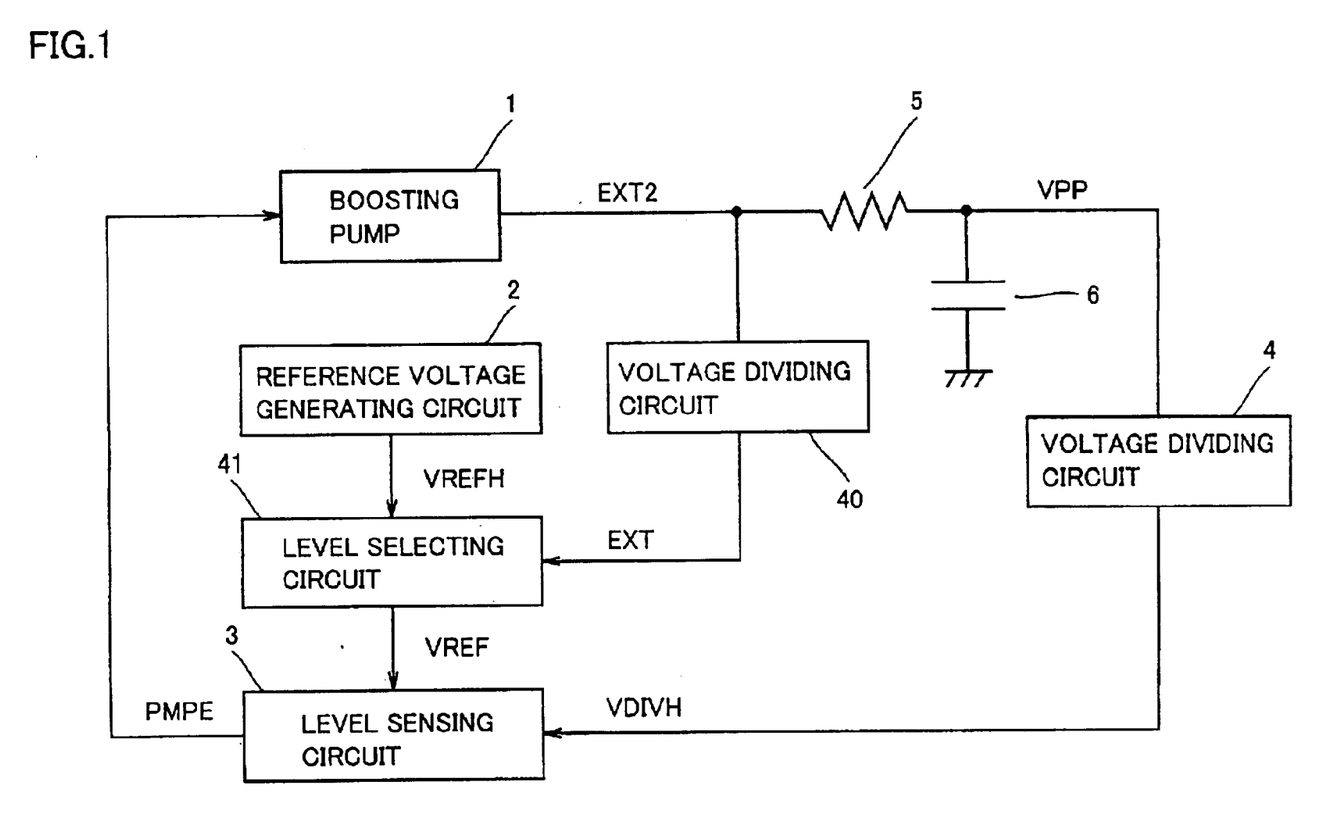
FIG. 1 is a functional block diagram illustrating functions of an internal voltage generating circuit according to a first embodiment of the present invention.

Referring to FIG. 1, an internal voltage generating circuit according to a first embodiment differs from the conventional internal voltage generating circuit shown in FIG. 8 only in that the former circuit includes a voltage dividing circuit 40 for dividing a maximum output voltage EXT2 which can be driven by a boosting pump 1, and a level selecting circuit 41 comparing the voltage level of a first reference voltage VREFH supplied from a reference voltage generating circuit 2 with the voltage level of a divided voltage EXT supplied from voltage dividing circuit 40 to select one of the voltages that has a lower level and provide the selected voltage as a second reference voltage VREF to a level sensing circuit 3. Description of other components common to these circuits is not repeated here.

As the internal voltage generating circuit is configured as shown in FIG. 1, the second reference voltage supplied from level selecting circuit 41 is a variable voltage having an upper limit equal to the maximum output voltage EXT2 which can be driven by boosting pump 1, while the reference voltage of the conventional internal voltage generating circuit shown in FIG. 8 is fixed at a predetermined voltage level.

Level sensing circuit 3 accordingly compares the level of the second reference voltage VREF supplied from level selecting circuit 41 with the level of a divided voltage VDIVH obtained through voltage-division of a boosted voltage VPP by a voltage dividing circuit 4 to provide a PMPE signal indicative of the result of the comparison to boosting pump 1.

Level sensing circuit 3 outputs PMPE signal of H level when the level of voltage VDIVH is lower than that of voltage VREF.

Boosting pump 1 receives the PMPE signal of H level to output a PCLK signal of a certain fixed cycle from a pump drive signal generating circuit 22 as shown in FIG. 12, and activates a charge pump operation of a pump circuit 23 to generate the maximum output voltage EXT2 and accordingly boosted voltage VPP is generated.

Figure 2:
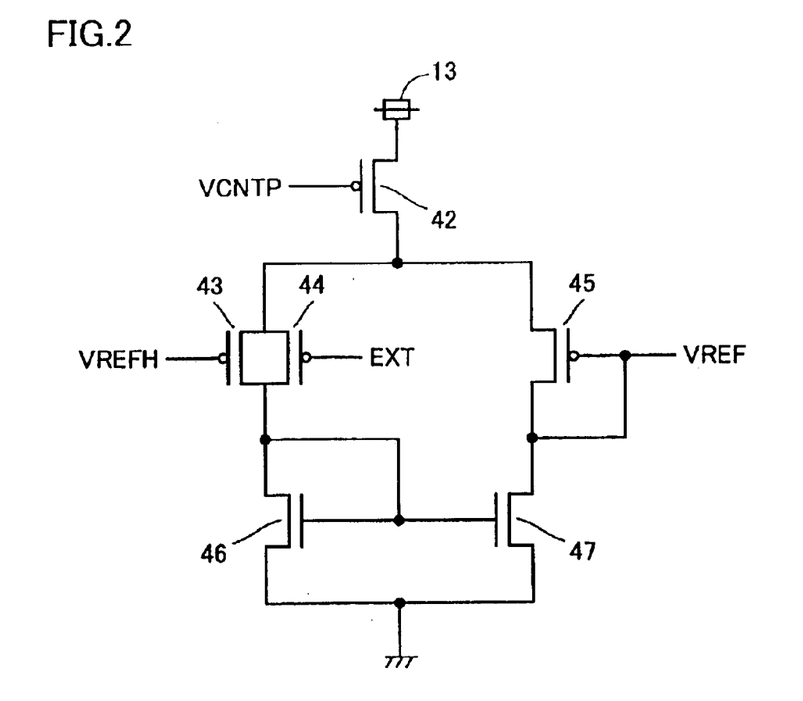
FIG. 2 is a detailed circuit diagram showing an exemplary level selecting circuit 41 of the internal voltage generating circuit according to the first embodiment of the present invention.

FIG. 2 is a detailed circuit diagram of an exemplary level selecting circuit 41 of the internal voltage generating circuit according to the first embodiment of the present invention.

Level selecting circuit 41 includes p-channel transistors 42, 43, 44 and 45 and n-channel transistors 46 and 47.

P-channel transistor 42 controls the current flowing through level selecting circuit 41, has its source connected to a power supply node of an external power supply Vdd 13 and has its drain connected to respective sources of p-channel transistors 43, 44 and 45. A potential VCTNP on the gate of p-channel transistor 42 is set approximately at a threshold voltage for the purpose of preventing increase of current within level selecting circuit 41.

Respective gates of p-channel transistors 43 and 44 are connected respectively to respective output terminals of reference voltage generating circuit 2 and voltage dividing circuit 40 to receive the first reference voltage VREFH and divided voltage EXT. Respective drains of p-channel transistors 43 and 44 are connected to the gate and drain of n-channel transistor 46 and to the gate of n-channel transistor 47.

N-channel transistor 46 and n-channel transistor 47 constitute a current mirror circuit so that a mirror current of the current flowing through n-channel transistor 46 flows through n-channel transistor 47.

The drain of n-channel transistor 47 is connected to the drain of diode-connected p-channel transistor 45. N-channel transistors 46 and 47 have respective sources both grounded.

Level selecting circuit 41 configured as shown in FIG. 2 receives the first reference voltage VREFH and divided voltage EXT. Then, one of p-channel transistors 43 and 44 that receives a signal of a lower voltage level is turned on to pass a larger electric current, and the gate potential of this transistor is supplied as the second reference voltage VREF from the drain of n-channel transistor 47 through the current mirror circuit constituted of n-channel transistors 46 and 47.

Figure 3:
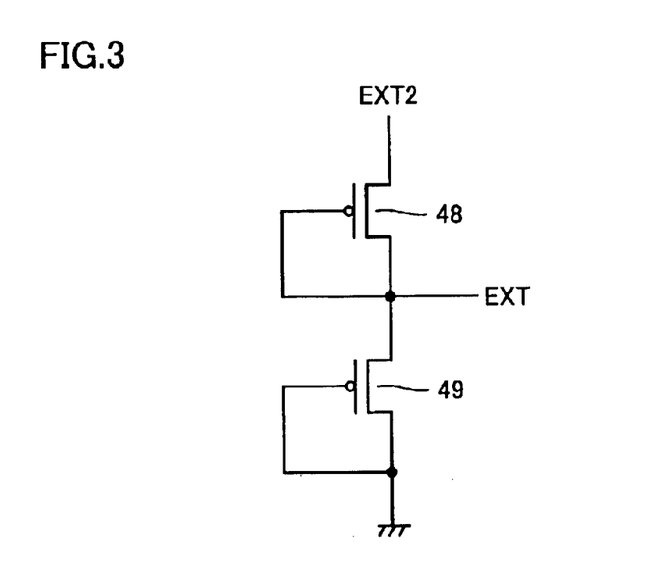
FIG. 3 is a detailed circuit diagram showing an exemplary voltage dividing circuit 40 of the internal voltage generating circuit according to the first embodiment of the present invention.

FIG. 3 is a detailed circuit diagram of an exemplary voltage dividing circuit 40 of the internal voltage generating circuit according to the first embodiment of the present invention.

Referring to FIG. 3, voltage dividing circuit 40 includes p-channel transistors 48 and 49 diode-connected in series. The maximum output voltage EXT2 from boosting pump 1 is divided and resultant divided voltage EXT is output from the drain of p-channel transistor 48.

Figures 4A, 4B:
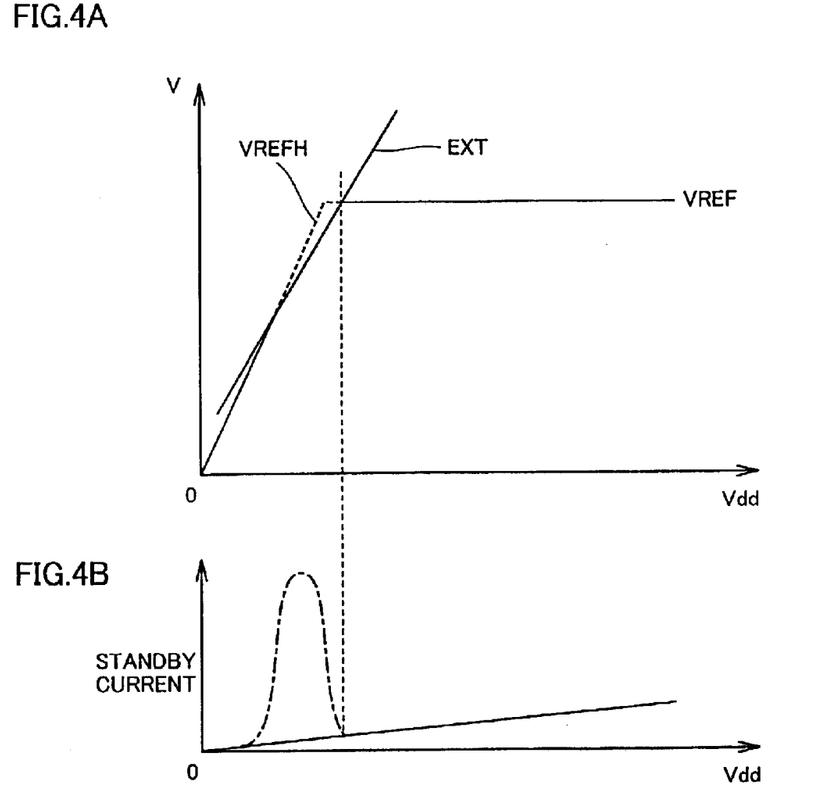
FIGS. 4A and 4B respectively show dependency on the external power supply voltage of reference voltage VREF and divided voltage EXT and that of standby current of the internal voltage generating circuit according to the first embodiment.

FIG. 4A shows dependency, on the external power supply voltage, of the second reference voltage VREF and divided voltage EXT of the maximum output voltage EXT2 of boosting pump 1. FIG. 4B shows dependency on the external power supply voltage of standby current of a semiconductor memory device.

Referring to FIG. 4A, the first reference voltage VREFH supplied from reference voltage generating circuit 2 shown in FIG. 1 increases as the external power supply voltage increases after power-on, and thereafter stays at a constant voltage level corresponding to a target level of divided voltage VDIVH of boosted voltage VPP.

Divided voltage EXT of the maximum output voltage EXT2 of boosting pump 1 increases, after power-on, in proportion to the external power supply voltage through charge pump operation of pump circuit 23 shown in FIG. 12.

Level selecting circuit 41 compares reference voltage VREFH with divided voltage EXT to select a voltage of a lower level that is the second reference voltage VREF having its waveform as shown in FIG. 4A.

It is seen from this waveform that divided voltage EXT of the maximum output voltage EXT2 of boosting pump 1 is selected instead of reference voltage VREFH and accordingly output as the second reference voltage VREF, for the region where divided voltage EXT has its level lower than that of the first reference voltage VREFH when the external power supply voltage is approximately at a lower limit as indicated by the dotted line in FIG. 4A.

Since boosting pump 1 is not required to perform a charge pump operation to a degree exceeding the drive ability of pump circuit 23 shown in FIG. 12, the excessive operation is prevented.

As shown in FIG. 4B, such an increase of the standby current of the semiconductor memory device as that occurring when the external power supply voltage of the conventional internal voltage generating circuit is at a lower limit is prevented and accordingly, the standby current is kept at a low level.

According to the first embodiment as heretofore discussed, the reference voltage of the internal voltage generating circuit is set in such a way that an upper limit of the reference voltage is equal to the maximum output voltage which can be driven by the boosting pump. Accordingly, the excessive operation of the boosting pump is prevented that could occur when the operating voltage is close to the lower limit of the external power supply voltage, and thus standby current of the semiconductor memory device can be reduced.

No influence is exerted on the operation of the semiconductor memory device in an active state when the operating voltage is in a normal operation range, since boosted voltage VPP is set at a predetermined target level.

Second Embodiment

Figure 5:
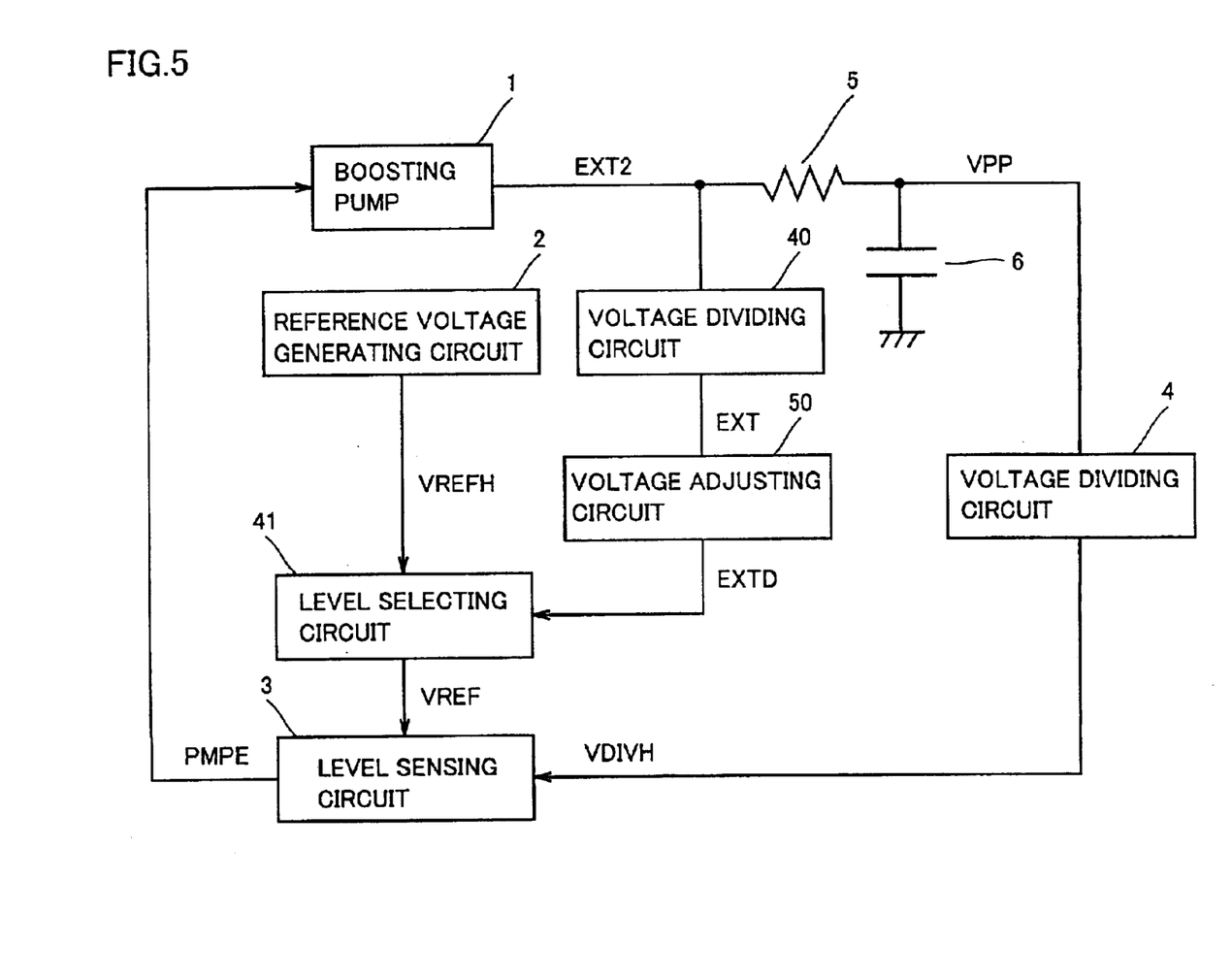
FIG. 5 is a functional block diagram illustrating functions of an internal voltage generating circuit according to a second embodiment of the present invention.

FIG. 5 is a functional block diagram illustrating functions of an internal voltage generating circuit according to a second embodiment of the present invention.

Referring to FIG. 5, the internal voltage generating circuit of the second embodiment differs from the internal voltage generating circuit of the first embodiment shown in FIG. 1 in that the former circuit has a voltage adjusting circuit 50 to be used for adjusting the level of divided voltage EXT of the maximum output voltage EXT2 of boosting pump 1 that is supplied from voltage dividing circuit 40, and supplying the resultant voltage with the adjusted level to level selecting circuit 41. Description of components common to these circuits is not repeated here.

Voltage adjusting circuit 50 of the internal voltage generating circuit configured as shown in FIG. 5 receives divided voltage EXT of the maximum output voltage EXT2 of boosting pump 1 from voltage dividing circuit 40, and then adjusts the voltage level of divided voltage EXT to a lower voltage level to output a resultant adjusted voltage EXTD.

Then, level selecting circuit 41 compares the first reference voltage VREFH from reference voltage generating circuit 2 with the level of adjusted voltage EXTD from voltage adjusting circuit 50 to provide, as the second reference voltage VREF, one of the voltages that has a lower voltage level, to level sensing circuit 3.

The second reference voltage VREF supplied from level sensing circuit 41 is thus a variable voltage having an upper limit lower than the level of the maximum output voltage EXT2 which can be driven by boosting pump 1, while the reference voltage of the conventional voltage generating circuit shown in FIG. 8 is fixed at a predetermined voltage level.

Figure 6:
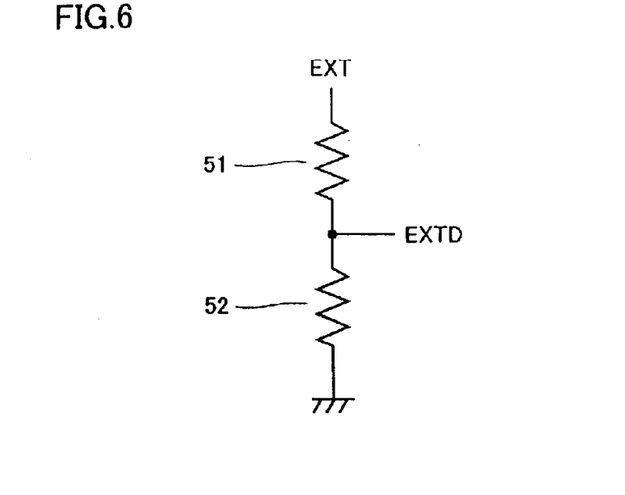
FIG. 6 is a circuit diagram showing an exemplary voltage adjusting circuit 50 of the internal voltage generating circuit according to the second embodiment of the present invention.

FIG. 6 is a circuit diagram showing an exemplary voltage adjusting circuit 50 shown in FIG. 5.

Voltage adjusting circuit 50 includes resistors 51 and 52 connected in series. Voltage adjusting circuit 50 receives divided voltage EXT of the maximum output voltage EXT2 to output, adjusted voltage EXTD having a voltage level still lower than that of divided voltage EXT, via a connection node of resistors 51 and 52, the adjusted voltage EXTD being obtained through voltage division by resistors 51 and 52.

Voltage adjusting circuit 50 configured as shown in FIG. 6 provides adjusted voltage EXTD which can be adjusted to a voltage level lower than that of divided voltage EXT according to set values of resistors 51 and 52. Here, in order to prevent the excessive operation of boosting pump 1 without lowering the drive ability of boosting pump 1 when the external voltage is approximately at its lower limit, adjusted voltage EXTD is set at a level (approximately 200–300 mV) slightly lower than that of divided voltage EXT.

Adjusted voltage EXTD lower than divided voltage EXT is thus supplied to the gate of p-channel transistor 44 of level selecting circuit 41 shown in FIG. 2. One of adjusted voltage EXTD and the first reference voltage VREFH supplied to the gate of p-channel transistor 43 that has a lower voltage level is selected, and the selected voltage is supplied as the second reference voltage VREF to level sensing circuit 3.

The second reference voltage VREF is supplied to the gate of n-channel transistor 19 in the level sensing circuit 3 shown in FIG. 11, and compared with divided voltage VDIVH of boosted voltage VPP supplied to the gate of n-channel transistor 18.

The sense signal PMPE indicative of the result of the comparison is generated via inverter 21. Then, boosting pump 1 performs the charge pump operation in pump circuit 23 shown in FIG. 12 according to the PMPE signal of H level and thus boosted voltage VPP is generated.

Figure 7A:
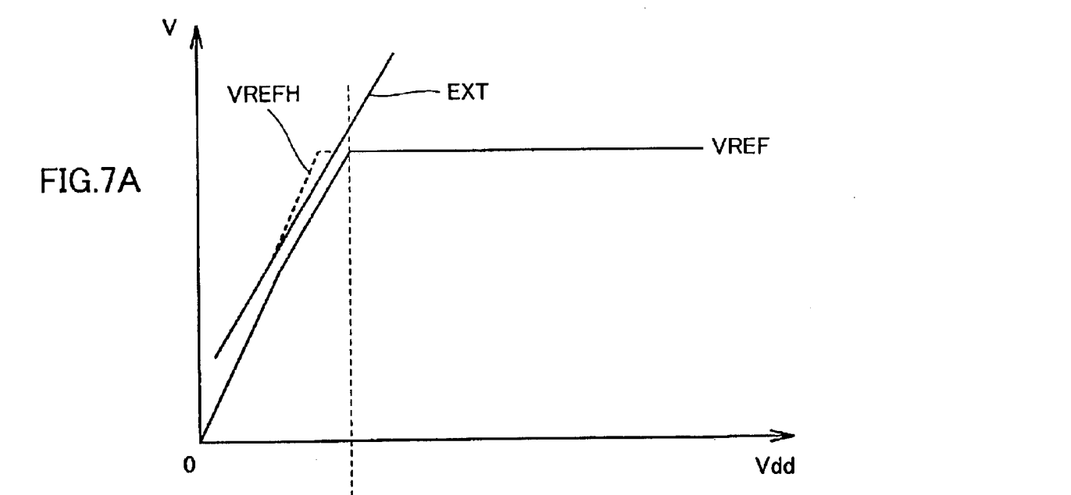
FIGS. 7A and 7B respectively show dependency on the external power supply voltage of a second reference voltage VREF and that of standby current of the internal voltage generating circuit according to the second embodiment of the present invention.

FIG. 7A shows dependency, on the external power supply voltage, of divided voltage EXT of the maximum output voltage EXT2 of boosting pump 1, the first reference voltage VREFH, and the second reference voltage VREF supplied from level selecting circuit 41 of the internal voltage generating circuit according to the second embodiment of the present invention.

Figure 7B:
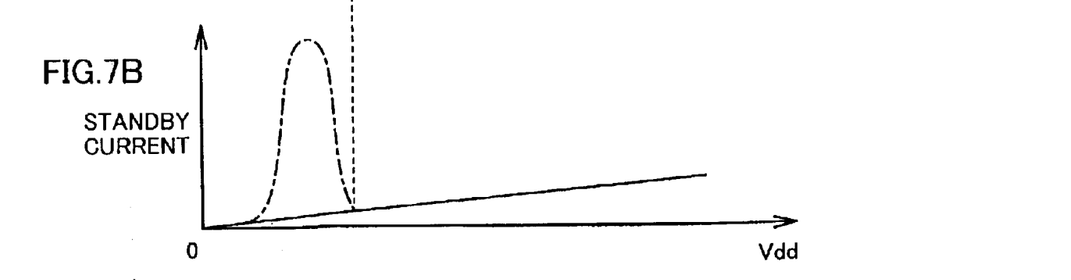

FIG. 7B shows dependency on the external power supply voltage of standby current of a semiconductor memory device including the internal voltage generating circuit of the second embodiment of the present invention.

Referring to FIG. 7A, the first reference voltage VREFH supplied from reference voltage generating circuit 2 increases with the increase of the external power supply voltage after power-on to reach and stay at a predetermined voltage level.

Divided voltage EXT supplied from voltage dividing circuit 40 increases in proportion to the external power supply voltage through the charge pump operation of pump circuit 23 shown in FIG. 12.

Here, level selecting circuit 41 compares the first reference voltage VREFH with divided voltage EXTD to select one of them that has a lower voltage level. The selected voltage is output as the second reference voltage VREF having a waveform shown in FIG. 7A.

Referring to this waveform, in the region where divided voltage EXT is lower than the first reference voltage VREFH and the external power supply voltage is approximately at its lower limit, adjusted voltage EXTD still lower in the voltage level than divided voltage EXT is selected to be output as the second reference voltage VREF.

Accordingly, boosting pump 1 performs a charge pump operation based on reference voltage VREF to the degree lower than the drive ability of pump circuit 23 in FIG. 12.

In other words, the level of the second reference voltage VREF is always equal to or lower than that of the maximum output voltage EXT2 which can be driven by boosting pump 1. Then, level sensing circuit 3 never requests boosting pump 1 to perform a charge pump operation to the degree exceeding the drive ability of boosting pump 1.

It is accordingly ensured that increase of the standby current is prevented that occurs when the external power supply voltage of the conventional semiconductor memory device is close to or at its lower limit, this increase being indicated by the dot-dashed line in FIG. 7B.

As heretofore discussed, according to the second embodiment, the reference voltage of the internal voltage generating circuit is set in such a way that an upper limit of the reference voltage is equal to a voltage level slightly lower than the maximum output voltage which can be driven by the boosting pump. Then, without deterioration in the drive ability of the boosting pump, the excessive operation of the boosting pump is surely avoided that could occur when the operating voltage of a semiconductor memory device is equal to the lower limit of the external power supply voltage. The standby current of the semiconductor memory device is thus reduced.

No influence is exerted on the operation of the semiconductor memory device in an active state when the operating voltage is in a normal operation range, since boosted voltage VPP is set at a predetermined target level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An internal voltage generating circuit generating an internal voltage of a semiconductor memory device, said internal voltage generating circuit staying in an operating state even when said semiconductor memory device is in a standby state, comprising:

a boosting circuit configured for performing a charge pump operation to generate said internal voltage from a drive voltage produced from a supplied power supply voltage;

a reference voltage generating circuit configured for generating a reference voltage, said reference voltage generating circuit supplying, as said reference voltage, a voltage having its upper limit corresponding to a voltage level that can be driven by said boosting circuit in operation; and a level sensing circuit configured for comparing said internal voltage with said reference voltage to output, to said boosting circuit, a signal indicative of result of the comparison to control on and off of said charge pump operation, wherein said reference voltage generating circuit includes
a constant voltage circuit configured for generating a predetermined voltage corresponding to a target level of said internal voltage,
a drive voltage input unit for inputting the drive voltage of said boosting circuit in operation, and
a comparing circuit for comparing said predetermined voltage with said drive voltage of said boosting circuit and selecting, as said reference voltage, one of said voltages that has a lower voltage level to supply the selected voltage to said level sensing circuit.

2. The internal voltage generating circuit according to claim 1, wherein said drive voltage input unit includes a voltage dividing circuit dividing said drive voltage, and an output voltage of said drive voltage input unit is a voltage resultant from said voltage division.

3. The internal voltage generating circuit according to claim 1, wherein said level sensing circuit includes a voltage dividing circuit dividing said internal voltage, and said reference voltage supplied from said reference voltage generating circuit is compared with said divided internal voltage to output said signal indicative of result of the comparison.

4. The internal voltage generating circuit according to claim 1, wherein said drive voltage input unit includes
a voltage dividing circuit configured for dividing said drive voltage, and
a voltage adjusting circuit capable of adjusting said voltage divided by said voltage dividing circuit to generate a voltage of a lower voltage level, and
an output voltage of said drive voltage input unit is the voltage supplied from said voltage adjusting circuit.

* * * * *